United States Patent
Nielsen et al.

(10) Patent No.: US 11,201,590 B2
(45) Date of Patent: Dec. 14, 2021

(54) POWER AMPLIFIER APPARATUS

(71) Applicant: Qorvo US, Inc., Greensboro, NC (US)

(72) Inventors: Michael Nielsen, Vodskov (DK); Lars Sandahl Ubbesen, Aalborg (DK)

(73) Assignee: Qorvo US, Inc., Greensboro, NC (US)

( * ) Notice: Subject to any disclaimer, the term of this patent is extended or adjusted under 35 U.S.C. 154(b) by 16 days.

(21) Appl. No.: 16/788,425

(22) Filed: Feb. 12, 2020

(65) Prior Publication Data

US 2021/0249995 A1  Aug. 12, 2021

(51) Int. Cl.
*H03F 1/02* (2006.01)
*H03F 3/19* (2006.01)
*H03F 3/21* (2006.01)

(52) U.S. Cl.
CPC ......... *H03F 1/0222* (2013.01); *H03F 1/0277* (2013.01); *H03F 3/19* (2013.01); *H03F 3/211* (2013.01); *H03F 2203/21127* (2013.01); *H03F 2203/21131* (2013.01)

(58) Field of Classification Search
CPC ........ H03F 1/0222; H03F 1/0277; H03F 3/19; H03F 3/211; H03F 2203/21127; H03F 2203/21131
USPC ........................................................ 330/277
See application file for complete search history.

(56) References Cited

U.S. PATENT DOCUMENTS

| | | | | |
|---|---|---|---|---|
| 5,774,017 A | * | 6/1998 | Adar | H03F 1/0261 330/126 |
| 2010/0321108 A1 | * | 12/2010 | Lee | H03G 3/3042 330/131 |
| 2016/0322947 A1 | * | 11/2016 | Ishihara | H03F 1/56 |

OTHER PUBLICATIONS

Cripps, S., "Advanced Techniques in RF Power Amplifier Design," 2002, Artech House, Inc., 339 pages.

* cited by examiner

*Primary Examiner* — Hafizur Rahman
(74) *Attorney, Agent, or Firm* — Withrow & Terranova, P.L.L.C.

(57) ABSTRACT

A power amplifier apparatus is provided. The power amplifier apparatus includes a number of multi-stage power amplifiers and a bias circuit configured to generate a number of bias signals (e.g., bias current or bias voltage) to control (e.g., activate or deactivate) the multi-stage power amplifiers. In examples disclosed herein, only one of the multi-stage power amplifiers is activated at a given time. In this regard, the bias circuit can generate the bias signals to collectively activate one of the multi-stage power amplifiers, while deactivating the rest of the multi-stage power amplifiers. As such, it may be possible to control a larger number of power amplifier stages based on a smaller number of bias signals. As a result, it may be possible to eliminate a biasing bump pad(s) from the power amplifier apparatus, thus helping to reduce the footprint and cost of the power amplifier apparatus.

20 Claims, 5 Drawing Sheets

POWER AMPLIFIER APPARATUS

FIELD OF THE DISCLOSURE

The technology of the disclosure relates generally to a power amplifier apparatus having multiple power amplifiers.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience depends on higher data rates offered by new generation wireless communication technologies such as fifth generation (5G) and 5G new-radio (5G-NR). To achieve desirable data rates and coverage range, the mobile communication device typically employs a power amplifier(s) to boost a wireless communication signal to a higher power prior to transmission.

An important figure of merit for the power amplifier(s) is cost. Given that the power amplifier(s) typically includes a number of heterojunction bipolar transistor (HBT) dies and bump pads, it may be necessary to reduce the cost of the HBT dies and the number of bump pads to reduce overall cost of the power amplifier(s). The power amplifier(s) can generally include three types of bump pads, namely radio frequency (RF) bump pads for passing the wireless communication signal to the HBT dies, ground bump pads for grounding, and biasing bump pads for biasing the HBT dies. Notably, the power amplifier(s) may suffer degraded performance if the RF bump pads and the ground bump pads are reduced. As such, it may be desirable to reduce the cost of the power amplifier(s) by reducing the number of the biasing bump pads associated with the power amplifier(s).

SUMMARY

Embodiments of the disclosure relate to a power amplifier apparatus. The power amplifier apparatus includes a number of multi-stage power amplifiers and a bias circuit configured to generate a number of bias signals (e.g., bias current or bias voltage) to control (e.g., activate or deactivate) the multi-stage power amplifiers. In examples disclosed herein, only one of the multi-stage power amplifiers is activated at a given time. In this regard, the bias circuit can generate the bias signals to collectively activate one of the multi-stage power amplifiers, while deactivating the rest of the multi-stage power amplifiers. As such, it may be possible to control a larger number of power amplifier stages based on a smaller number of bias signals. For example, the bias circuit may control a pair of two-stage power amplifiers using three bias signals. As a result, it may be possible to eliminate a biasing bump pad(s) from the power amplifier apparatus, thus helping to reduce the footprint and cost of the power amplifier apparatus.

In one aspect, a power amplifier apparatus is provided. The power amplifier apparatus includes a first multi-stage power amplifier configured to amplify a first radio frequency (RF) signal. The power amplifier apparatus also includes a second multi-stage power amplifier configured to amplify a second RF signal. The power amplifier apparatus also includes a bias circuit configured to generate a number of bias signals. The bias signals are configured to collectively activate one of the first multi-stage power amplifier and the second multi-stage power amplifier. The bias signals are also configured to collectively deactivate another one of the first multi-stage power amplifier and the second multi-stage power amplifier.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
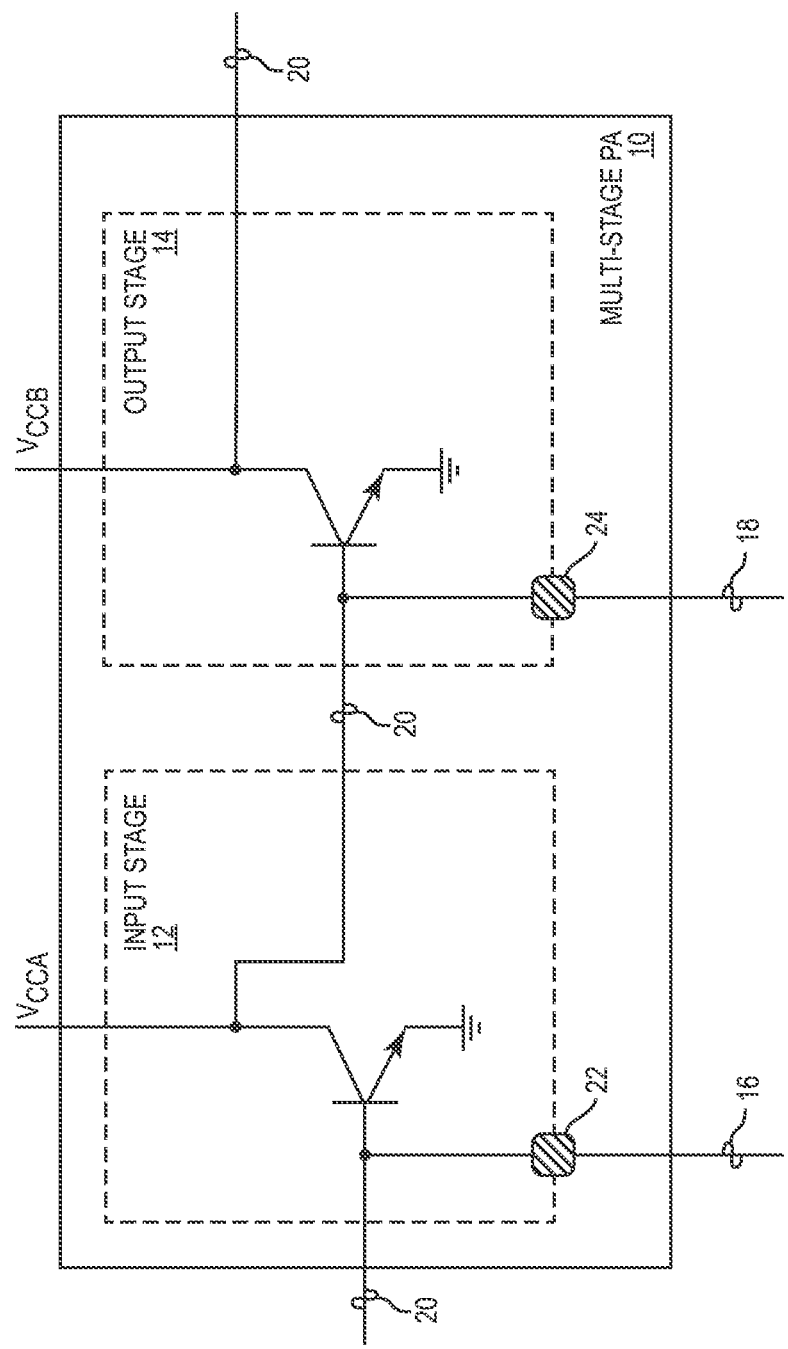
FIG. 1 is a schematic diagram of an exemplary multi-stage power amplifier.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a power amplifier apparatus. The power amplifier apparatus includes a number of multi-stage power amplifiers and a bias circuit configured to generate a number of bias signals (e.g., bias current or bias voltage) to control (e.g., activate or deactivate) the multi-stage power amplifiers. In examples disclosed herein, only one of the multi-stage power amplifiers is activated at a given time. In this regard, the bias circuit can generate the bias signals to collectively activate one of the multi-stage power amplifiers, while deactivating the rest of the multi-stage power amplifiers. As such, it may be possible to control a larger number of power amplifier stages based on a smaller number of bias signals. For example, the bias circuit may control a pair of two-stage power amplifiers using three bias signals. As a result, it may be possible to eliminate a biasing bump pad(s) from the power amplifier apparatus, thus helping to reduce the footprint and cost of the power amplifier apparatus.

Figure 2:
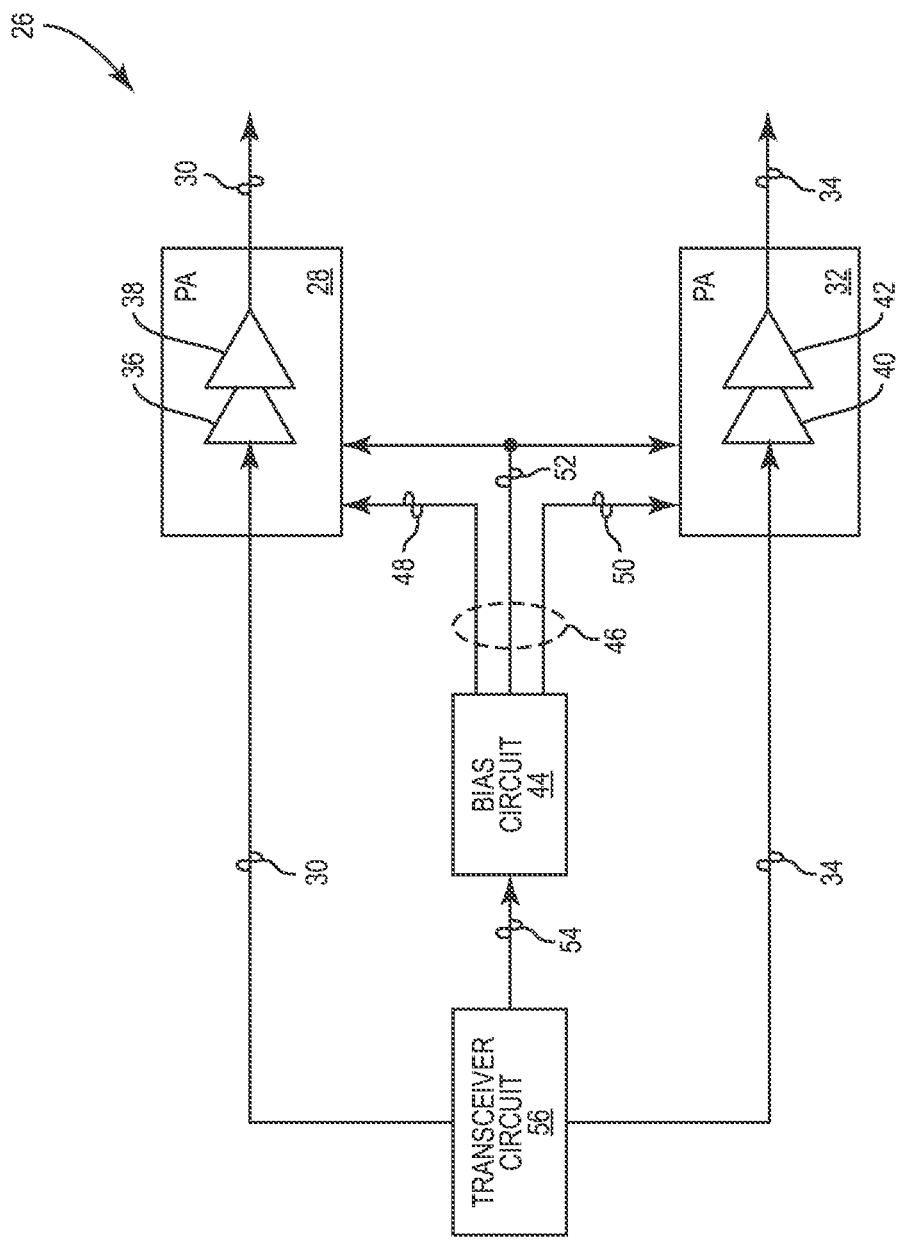
FIG. 2 is a schematic diagram of an exemplary power amplifier apparatus configured to reduce a number of biasing bump pads required for biasing a number of multi-stage power amplifiers, such as the multi-stage power amplifier of FIG. 1.

Before discussing the power amplifier apparatus of the present disclosure starting at FIG. 2, a brief overview of a conventional multi-stage power amplifier is first provided with reference to FIG. 1 to help explain certain key characteristics and operational principles of the multi-stage power amplifier.

FIG. 1 is a schematic diagram of an exemplary multi-stage power amplifier 10. In a non-limiting example, the multi-stage power amplifier 10 is a two-stage power amplifier consisting of an input stage heterojunction bipolar transistor (HBT) 12 and an output stage HBT 14. The input stage HBT 12 may be activated by asserting an input stage bias signal 16 (e.g., a current signal or a voltage signal) above an input bias threshold or deactivated by de-asserting the input stage bias signal 16 to below the input bias threshold. Similarly, the output stage HBT 14 may be activated by asserting an output stage bias signal 18 (e.g., a current signal or a voltage signal) above an output bias threshold or deactivated by de-asserting the output stage bias signal 18 to below the output bias threshold.

When the input stage HBT 12 is activated, the input stage HBT 12 can receive and amplify an RF signal 20 based on an input stage voltage $V_{CCA}$. Likewise, when the output stage HBT 14 is activated, the output stage HBT 14 can amplify and output the RF signal 20 based on an output stage voltage $V_{CCB}$. Both the input stage voltage $V_{CCA}$ and the output stage voltage $V_{CCB}$ can be either envelope tracking (ET) voltages or average power tracking (APT) voltages.

The multi-stage power amplifier 10 also includes a pair of biasing bump pads 22 and 24 configured to couple the input stage bias signal 16 and the output stage bias signal 18 to the input stage HBT 12 and the output stage HBT 14, respectively. Notably, a wireless communication device (e.g., a smartphone) often employs multiple power amplifiers to amplify RF signals in different frequency bands. As such, the number of biasing bump pads required by the wireless communication device increases in proportion to the number of power amplifiers and the number of stages in each of the power amplifiers. In this regard, it may be desirable to reduce the cost of the wireless communication device by reducing the number of the biasing bump pads associated with the power amplifier(s).

In this regard, FIG. 2 is a schematic diagram of a power amplifier apparatus 26 configured to reduce a number of biasing bump pads required for biasing a number of multi-stage power amplifiers, such as the multi-stage power amplifier 10 of FIG. 1. The power amplifier apparatus 26 includes a first multi-stage power amplifier 28 configured to amplify a first RF signal 30 and a second multi-stage power amplifier 32 configured to amplify a second RF signal 34. In a non-limiting example, the first multi-stage power amplifier 28 includes a first input stage 36 and a first output stage 38 coupled to the first input stage 36. Each of the first input stage 36 and the first output stage 38 may include a respective HBT or any type of field-effect transistors (FETs). Similarly, the second multi-stage power amplifier 32 includes a second input stage 40 and a second output stage 42 coupled to the second input stage 40. Each of the second input stage 40 and the second output stage 42 may include a respective HBT or any type of FETs.

Like the multi-stage power amplifier 10 of FIG. 1, each of the first input stage 36, the first output stage 38, the second input stage 40, and the second output stage 42 can be activated by a respective bias signal above a respective bias threshold or deactivated by the respective bias signal below the respective bias threshold. In this regard, the power amplifier apparatus 26 further includes a bias circuit 44 configured to generate a number of bias signals 46 for controlling the first input stage 36, the first output stage 38, the second input stage 40, and the second output stage 42.

In examples disclosed herein, the bias circuit 44 is configured to capitalize on a configuration option that requires only one of the first multi-stage power amplifier 28 and the second multi-stage power amplifier 32 to be activated at any given time. Specifically, the bias circuit 44 is configured to generate the bias signals 46 to collectively activate one of the first multi-stage power amplifier 28 and the second multi-stage power amplifier 32 and deactivate another one of the first multi-stage power amplifier 28 and the second multi-stage power amplifier 32. For example, the bias circuit 44 can generate the bias signals 46 to concurrently activate the first multi-stage power amplifier 28 and deactivate the second multi-stage power amplifier 32 or deactivate the first multi-stage power amplifier 28 and activate the second multi-stage power amplifier 32.

As discussed in detail below, it may be possible to reduce the biasing bump pads in the power amplifier apparatus 26 by generating the bias signals 46 to collectively control the first multi-stage power amplifier 28 and the second multi-stage power amplifier 32. In a non-limiting example, the bias circuit 44 is configured to generate the bias signals 46 that include a first bias signal 48, a second bias signal 50, and a common bias signal 52. The first bias signal 48 is configured to bias the first multi-stage power amplifier 28, the second bias signal 50 is configured to bias the second multi-stage power amplifier 32, and the common bias signal 52 is configured to bias both the first multi-stage power amplifier 28 and the second multi-stage power amplifier 32. In this regard, the bias circuit 44 can use the first bias signal 48, the second bias signal 50, and the common bias signal 52 to collectively activate or deactivate any of the first multi-stage power amplifier 28 and the second multi-stage power amplifier 32.

More specifically, the bias circuit 44 can utilize the bias circuit 44 can use the first bias signal 48, the second bias signal 50, and the common bias signal 52 to collectively control the first input stage 36, the first output stage 38, the second input stage 40, and the second output stage 42. Given that only three (3) bias signals are needed to control the first multi-stage power amplifier 28 and the second multi-stage power amplifier 32, it may be possible to eliminate at least one biasing bump pad from the power amplifier apparatus 26. As a result, it may be possible to reduce the footprint and cost of the power amplifier apparatus 26.

Notably, each of the first multi-stage power amplifier 28 and the second multi-stage power amplifier 32 may include additional stages that need to be biased respectively. In addition, the power amplifier apparatus 26 can be configured to include additional multi-stage power amplifiers for amplifying additional RF signals. In this regard, the bias circuit 44 may help eliminate even more biasing bump pads from the power amplifier apparatus 26 by utilizing the bias signals 46 to collectively control all the additional stages and/or the additional multi-stage power amplifiers.

The bias circuit 44 may receive a bias indication signal 54 indicative of which one of the first multi-stage power amplifier 28 and the second multi-stage power amplifier 32 to be activated. Accordingly, the bias circuit 44 may generate the bias signals 46 to collectively activate one of the first multi-stage power amplifier 28 and the second multi-stage power amplifier 32 and deactivate another one of the first multi-stage power amplifier 28 and the second multi-stage power amplifier 32. The bias circuit 44 may receive the bias indication signal 54 from a transceiver circuit 56, which also generates the first RF signal 30 and the second RF signal 34. The transceiver circuit 56 may be integrated into the power amplifier apparatus 26 or be provided in a separate system-on-chip (SoC) die from the power amplifier apparatus 26.

Figure 3A:
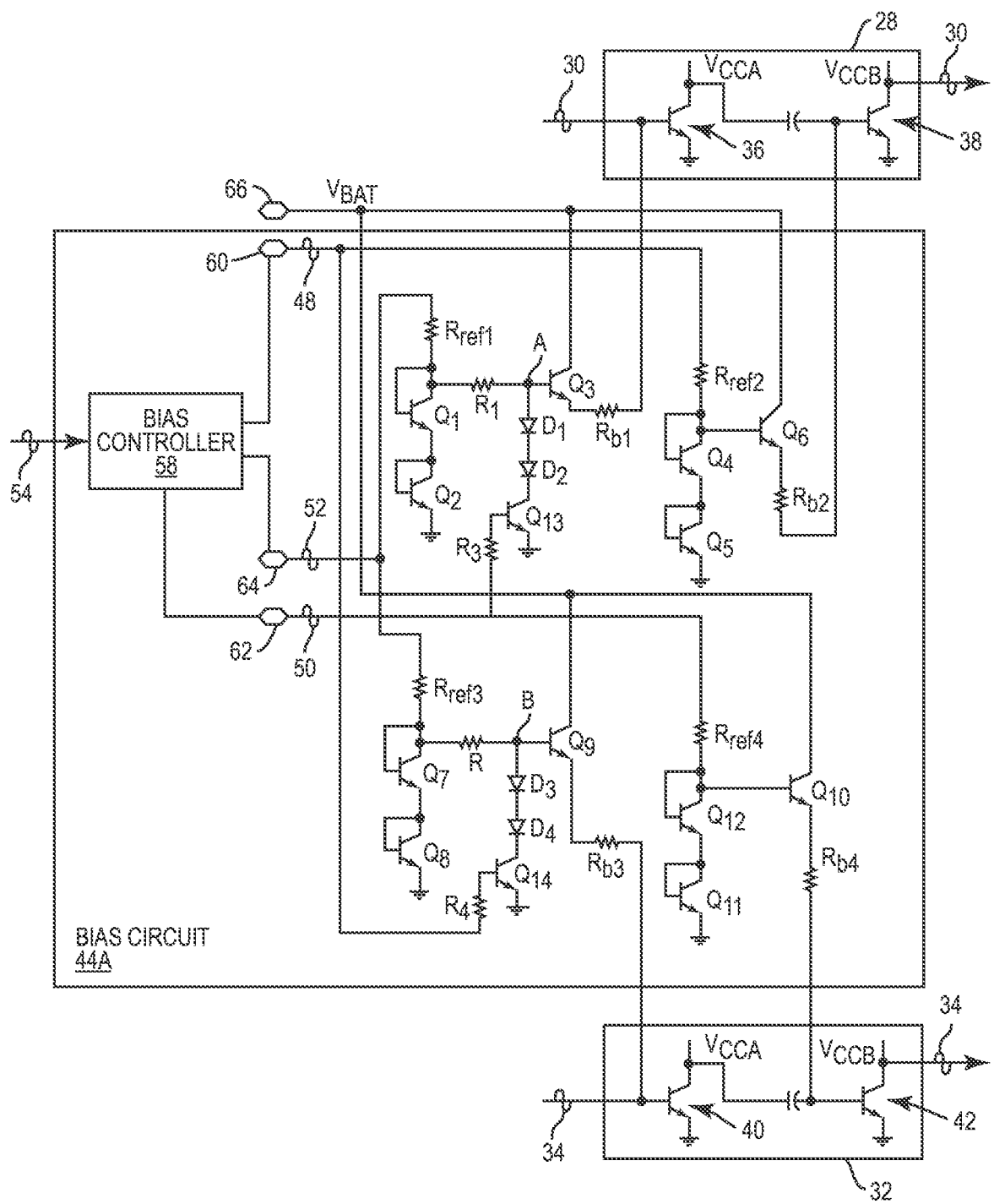
FIGS. 3A-3C are schematic diagrams providing exemplary illustrations of the power amplifier apparatus of FIG. 2 configured according to different embodiments of the present disclosure.
Figure 3B:
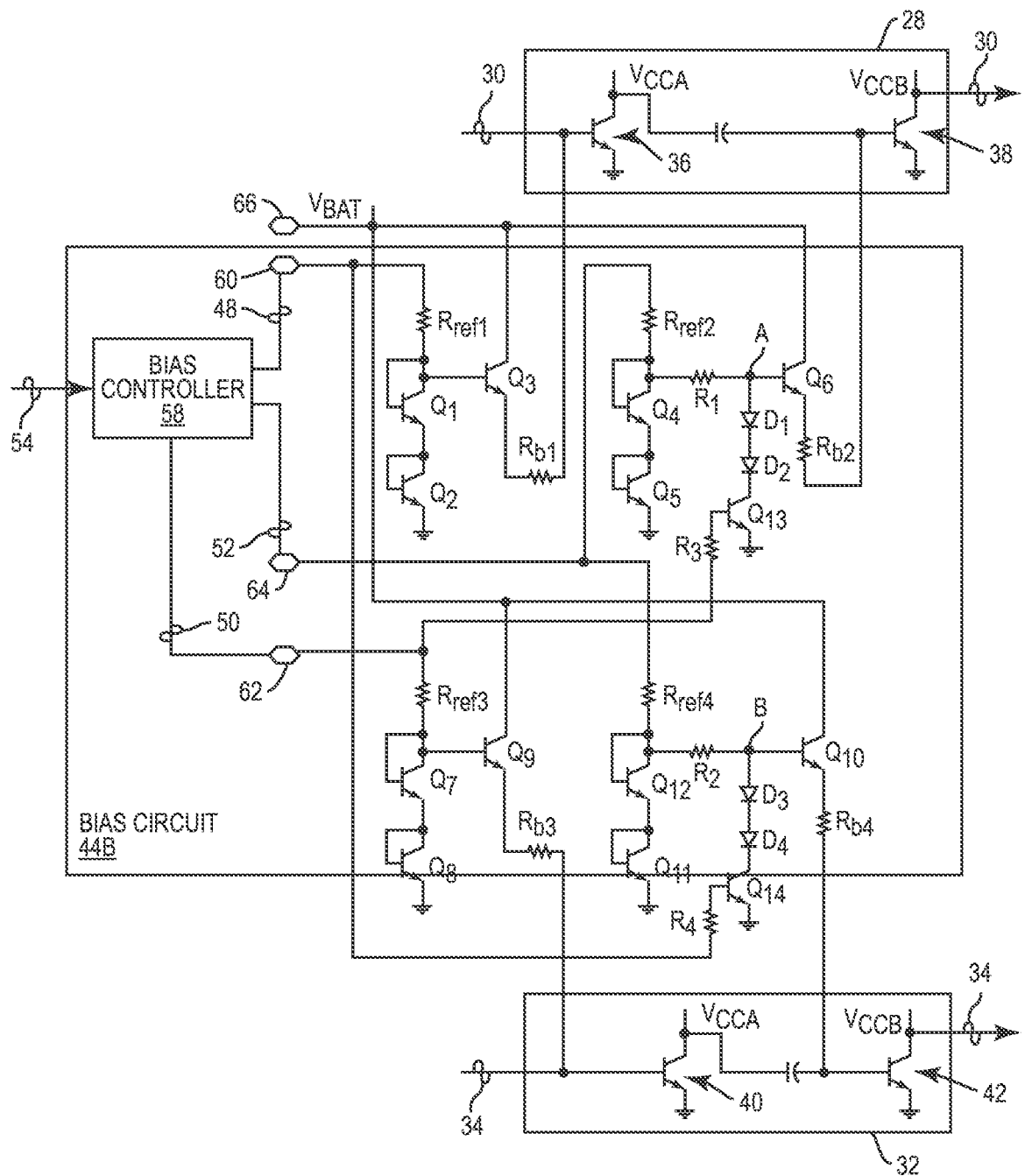
Figure 3C:
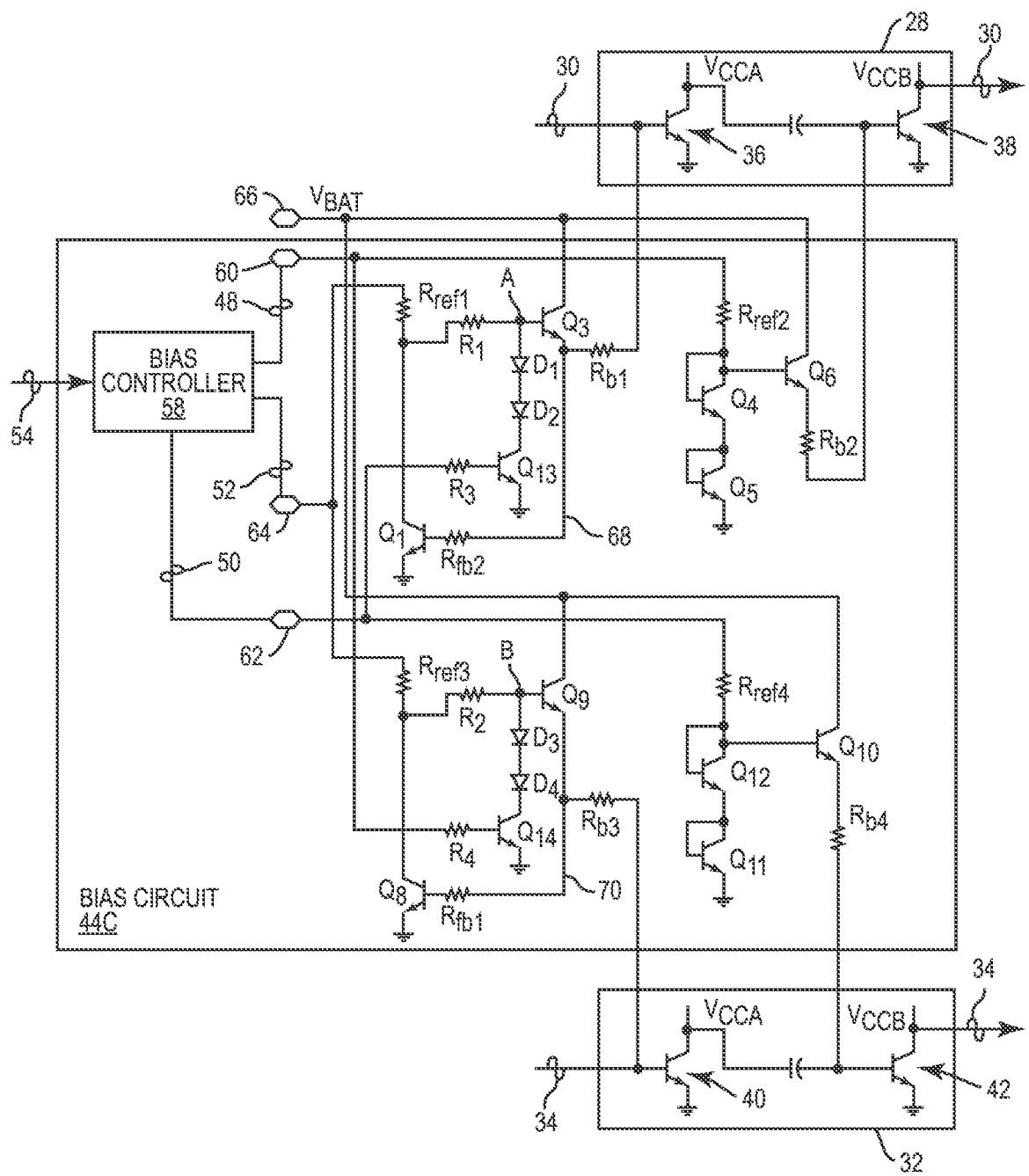

The bias circuit 44 may be configured to generate the bias signals 46 to collectively control the first multi-stage power amplifier 28 and the second multi-stage power amplifier 32 in accordance to a number of embodiments, as discussed in detail in FIGS. 3A-3C next. In this regard, FIGS. 3A-3C are schematic diagrams providing exemplary illustrations of the power amplifier apparatus 26 of FIG. 2 configured according to different embodiments of the present disclosure. Common elements between FIGS. 2 and 3A-3C are shown therein with common element numbers and will not be re-described herein.

FIG. 3A is a schematic diagram of an exemplary bias circuit 44A, which can be provided in the power amplifier apparatus 26 of FIG. 2 as the bias circuit 44. The bias circuit 44A includes a bias controller 58, which may be implemented by a field-programmable gate array (FPGA), as an example. The bias controller 58 may be configured to receive the bias indication signal 54 and generate the first bias signal 48, the second bias signal 50, and the common bias signal 52 accordingly. Notably, the first bias signal 48, the second bias signal 50, and the common bias signal 52 can be a number of bias current signals or a number of bias voltage signals.

The bias circuit 44A may be configured to include a first biasing bump pad 60, a second biasing bump pad 62, and a common biasing bump pad 64 configured to receive the first bias signal 48, the second bias signal 50, and the common bias signal 52, respectively. The bias circuit 44A may also include a supply bump pad 66 configured to receive a battery voltage $V_{BAT}$.

The first biasing bump pad 60 is coupled to the first output stage 38 of the first multi-stage power amplifier 28. Accordingly, the first bias signal 48 is configured to activate or deactivate the first output stage 38 of the first multi-stage power amplifier 28. In a non-limiting example, the first biasing bump pad 60 is coupled to the first output stage 38 via a resistor $R_{ref2}$, a transistor $Q_6$, and a resistor $R_{b2}$. The resistor $R_{ref2}$ is further coupled to a ground via transistors $Q_4$ and $Q_5$. The first biasing bump pad 60 is further coupled to a transistor $Q_{14}$ via a resistor $R_4$.

The second biasing bump pad 62 is coupled to the second output stage 42 of the second multi-stage power amplifier 32. Accordingly, the second bias signal 50 is configured to activate or deactivate the second output stage 42 of the second multi-stage power amplifier 32. In a non-limiting example, the second biasing bump pad 62 is coupled to the second output stage 42 via a resistor $R_{ref4}$, a transistor $Q_{10}$, and a resistor $R_{b4}$. The resistor $R_{ref4}$ is further coupled to the ground via transistors $Q_{12}$ and $Q_{11}$. The second biasing bump pad 62 is further coupled to a transistor $Q_{13}$ via a resistor $R_3$.

The common biasing bump pad 64 is coupled to the first input stage 36 of the first multi-stage power amplifier 28 as well as the second input stage 40 of the second multi-stage power amplifier 32. Accordingly, the common bias signal 52 can be configured to activate or deactivate the first input stage 36 of the first multi-stage power amplifier 28 and the second input stage 40 of the second multi-stage power amplifier 32. In a non-limiting example, the common biasing bump pad 64 is coupled to the first input stage 36 of the first multi-stage power amplifier 28 via a resistor $R_{ref1}$, a resistor $R_1$, a transistor $Q_3$, and a resistor $R_{b1}$. The resistor $R_{ref1}$ is further coupled to the ground via transistors $Q_1$ and $Q_2$. A coupling node A, which is located in between the resistor $R_1$ and the transistor $Q_3$, is coupled to the ground via diodes $D_1$ and $D_2$, and the transistor $Q_{13}$.

In the same non-limiting example, the common biasing bump pad 64 is coupled to the second input stage 40 of the second multi-stage power amplifier 32 via a resistor $R_{ref3}$, a resistor $R_2$, a transistor $Q_9$, and a resistor $R_{b3}$. The resistor $R_{ref3}$ is further coupled to the ground via transistors $Q_7$ and $Q_8$. Another coupling node B, which is located in between the resistor $R_2$ and the transistor $Q_9$, is also coupled to the ground via diodes $D_3$ and $D_4$, and the transistor $Q_{14}$.

In one example, the bias circuit 44A is configured to activate the first multi-stage power amplifier 28 and deactivate the second multi-stage power amplifier 32 concurrently. In this regard, the bias controller 58 is configured to assert the first bias signal 48 and the common bias signal 52, while simultaneously de-asserting the second bias signal 50. Herein, an assertion of the first bias signal 48 and the common bias signal 52 means that the bias controller 58 generates the first bias signal 48 and the common bias signal 52 above respective biasing thresholds. In contrast, a de-assertion of the second bias signal 50 means that the bias controller 58 generates the second bias signal 50 below a respective biasing threshold.

The bias controller 58 may assert the first bias signal 48 above a respective biasing voltage of the transistor $Q_6$ to cause the transistor $Q_6$ to be turned on. Accordingly, the battery voltage $V_{BAT}$ can be coupled to the first multi-stage power amplifier 28 to cause the first output stage 38 to be activated. The bias controller 58 may assert the first bias signal 48 above a respective biasing voltage of the transistor $Q_{14}$ to cause the transistor $Q_{14}$ to be turned on. Accordingly, a voltage at the coupling node B is pulled to the ground. As a result, the transistor $Q_9$ is turned off to block the common bias signal 52 from the second input stage 40 of the second multi-stage power amplifier 32, thus causing the second input stage 40 of the second multi-stage power amplifier 32 to be deactivated. Notably, the diodes $D_3$ and $D_4$ are provided between the coupling node B and the ground to prevent excessive current drain from the common biasing bump pad 64 to the ground via the resistor $R_{ref3}$, the diodes $D_3$ and $D_3$, and the transistor $Q_{14}$.

The bias controller 58 may assert the common bias signal 52 above a respective biasing voltage of the transistor $Q_3$ to cause the transistor $Q_3$ to be turned on. Accordingly, the battery voltage $V_{BAT}$ can be coupled to the first multi-stage power amplifier 28 to cause the first input stage 36 to be activated. The bias controller 58 may assert the second bias signal 50 below a respective biasing voltage of the transistor $Q_{10}$ to cause the transistor $Q_{10}$ to be turned off, thus blocking the battery voltage $V_{BAT}$ from the second multi-stage power amplifier 32 to cause the second output stage 42 to be deactivated.

In this regard, since the first input stage 36 and the first output stage 38 of the first multi-stage power amplifier 28 are both activated, the first multi-stage power amplifier 28 is thus activated. In contrast, since the second input stage 40 and the second output stage 42 of the second multi-stage power amplifier 32 are both deactivated, the second multi-stage power amplifier 32 is thus deactivated.

In another example, the bias circuit 44A is configured to deactivate the first multi-stage power amplifier 28 and activate the second multi-stage power amplifier 32 concurrently. In this regard, the bias controller 58 is configured to assert the second bias signal 50 and the common bias signal 52, while simultaneously de-asserting the first bias signal 48. Herein, an assertion of the second bias signal 50 and the common bias signal 52 means that the bias controller 58 generates the second bias signal 50 and the common bias signal 52 above respective biasing thresholds. In contrast, a de-assertion of the first bias signal 48 means that the bias controller 58 generates the first bias signal 48 below a respective biasing threshold.

The bias controller 58 may assert the second bias signal 50 above a respective biasing voltage of the transistor $Q_{10}$ to cause the transistor $Q_{10}$ to be turned on. Accordingly, the battery voltage $V_{BAT}$ can be coupled to the second multi-stage power amplifier 32 to cause the second output stage 42 to be activated. The bias controller 58 may assert the second bias signal 50 above a respective biasing voltage of the transistor $Q_{13}$ to cause the transistor $Q_{13}$ to be turned on. Accordingly, a voltage at the coupling node A is pulled to the ground. As a result, the transistor $Q_3$ is turned off to block the common bias signal 52 from the first input stage 36 of the first multi-stage power amplifier 28, thus causing the first input stage 36 of the first multi-stage power amplifier 28 to be deactivated. Notably, the diodes $D_1$ and $D_2$ are provided between the coupling node A and the ground to prevent excessive current drain from the common biasing bump pad 64 to the ground via the resistor $R_{ref1}$, the diodes $D_1$ and $D_2$, and the transistor $Q_{13}$.

The bias controller 58 may assert the common bias signal 52 above a respective biasing voltage of the transistor $Q_9$ to cause the transistor $Q_9$ to be turned on. Accordingly, the battery voltage $V_{BAT}$ can be coupled to the second multi-stage power amplifier 32 to cause the second input stage 40 to be activated. The bias controller 58 may assert the first bias signal 48 below a respective biasing voltage of the transistor $Q_6$ to cause the transistor $Q_6$ to be turned off, thus blocking the battery voltage $V_{BAT}$ from the first multi-stage power amplifier 28 to cause the first output stage 38 to be deactivated.

In this regard, since the first input stage 36 and the first output stage 38 of the first multi-stage power amplifier 28 are both deactivated, the first multi-stage power amplifier 28 is thus deactivated. In contrast, since the second input stage 40 and the second output stage 42 of the second multi-stage power amplifier 32 are both activated, the second multi-stage power amplifier 32 is thus activated.

FIG. 3B is a schematic diagram of an exemplary bias circuit 44B, which can be provided in the power amplifier apparatus 26 of FIG. 2 as the bias circuit 44. In the bias circuit 44B, the first biasing bump pad 60 is coupled to the first input stage 36 of the first multi-stage power amplifier 28. Accordingly, the first bias signal 48 is configured to activate or deactivate the first input stage 36 of the first multi-stage power amplifier 28. In a non-limiting example, the first biasing bump pad 60 is coupled to the first input stage 36 via the resistor $R_{ref1}$, the transistor $Q_3$, and the resistor $R_{b1}$. The resistor $R_{ref1}$ is further coupled to a ground via the transistors $Q_1$ and $Q_2$. The first biasing bump pad 60 is further coupled to the transistor $Q_{14}$ via the resistor $R_4$.

The second biasing bump pad 62 is coupled to the second input stage 40 of the second multi-stage power amplifier 32. Accordingly, the second bias signal 50 is configured to activate or deactivate the second input stage 40 of the second multi-stage power amplifier 32. In a non-limiting example, the second biasing bump pad 62 is coupled to the second input stage 40 via the resistor $R_{ref3}$, the transistor $Q_9$, and the resistor $R_{b3}$. The resistor $R_{ref3}$ is further coupled to the ground via the transistors $Q_7$ and $Q_8$. The second biasing bump pad 62 is further coupled to the transistor $Q_{13}$ via the resistor $R_3$.

The common biasing bump pad 64 is coupled to the first output stage 38 of the first multi-stage power amplifier 28 as well as the second output stage 42 of the second multi-stage power amplifier 32. Accordingly, the common bias signal 52 can be configured to activate or deactivate the first output stage 38 of the first multi-stage power amplifier 28 and the second output stage 42 of the second multi-stage power amplifier 32. In a non-limiting example, the common biasing bump pad 64 is coupled to the first output stage 38 of the first multi-stage power amplifier 28 via the resistor $R_{ref2}$, the resistor $R_1$, the transistor $Q_6$, and the resistor $R_{b2}$. The resistor $R_{ref2}$ is further coupled to the ground via the transistors $Q_4$ and $Q_5$. A coupling node A, which is located in between the resistor $R_1$ and the transistor $Q_6$, is coupled to the ground via diodes $D_1$ and $D_2$ and the transistor $Q_{13}$. In the same non-limiting example, the common biasing bump pad 64 is coupled to the second output stage 42 of the second multi-stage power amplifier 32 via the resistor $R_{ref4}$, the resistor $R_2$, the transistor $Q_{10}$, and the resistor $R_{b4}$. The resistor $R_{ref4}$ is further coupled to the ground via the transistors $Q_{12}$ and $Q_{11}$. Another coupling node B, which is located in between the resistor $R_2$ and the transistor $Q_{10}$, is coupled to the ground via diodes $D_3$ and $D_4$ and the transistor $Q_{14}$.

In one example, the bias circuit 44B is configured to activate the first multi-stage power amplifier 28 and deactivate the second multi-stage power amplifier 32 concurrently. In this regard, the bias controller 58 is configured to assert the first bias signal 48 and the common bias signal 52, while simultaneously de-asserting the second bias signal 50. Herein, an assertion of the first bias signal 48 and the common bias signal 52 means that the bias controller 58 generates the first bias signal 48 and the common bias signal 52 above respective biasing thresholds. In contrast, a de-assertion of the second bias signal 50 means that the bias controller 58 generates the second bias signal 50 below a respective biasing threshold.

The bias controller 58 may assert the first bias signal 48 above a respective biasing voltage of the transistor $Q_3$ to cause the transistor $Q_3$ to be turned on. Accordingly, the battery voltage $V_{BAT}$ can be coupled to the first multi-stage power amplifier 28 to cause the first input stage 36 to be activated. The bias controller 58 may assert the first bias signal 48 above a respective biasing voltage of the transistor $Q_{14}$ to cause the transistor $Q_{14}$ to be turned on. Accordingly, a voltage at the coupling node B is pulled to the ground. As a result, the transistor $Q_{10}$ is turned off to block the common bias signal 52 from the second output stage 42 of the second multi-stage power amplifier 32, thus causing the second output stage 42 of the second multi-stage power amplifier 32 to be deactivated. Notably, the diodes $D_3$ and $D_4$ are provided between the coupling node B and the ground to prevent excessive current drain from the common biasing bump pad 64 to the ground via the resistor $R_{ref4}$, the resistor $R_2$, the diodes $D_3$ and $D_3$, and the transistor $Q_{14}$.

The bias controller 58 may assert the common bias signal 52 above a respective biasing voltage of the transistor $Q_6$ to cause the transistor $Q_6$ to be turned on. Accordingly, the battery voltage $V_{BAT}$ can be coupled to the first multi-stage power amplifier 28 to cause the first output stage 38 to be activated. The bias controller 58 may assert the second bias signal 50 below a respective biasing voltage of the transistor $Q_9$ to cause the transistor $Q_9$ to be turned off, thus blocking the battery voltage $V_{BAT}$ from the second multi-stage power amplifier 32 to cause the second input stage 40 to be deactivated.

In this regard, since the first input stage 36 and the first output stage 38 of the first multi-stage power amplifier 28 are both activated, the first multi-stage power amplifier 28 is thus activated. In contrast, since the second input stage 40 and the second output stage 42 of the second multi-stage power amplifier 32 are both deactivated, the second multi-stage power amplifier 32 is thus deactivated.

In another example, the bias circuit 44B is configured to deactivate the first multi-stage power amplifier 28 and activate the second multi-stage power amplifier 32 concurrently. In this regard, the bias controller 58 is configured to assert the second bias signal 50 and the common bias signal 52, while simultaneously de-asserting the first bias signal 48. Herein, an assertion of the second bias signal 50 and the common bias signal 52 means that the bias controller 58 generates the second bias signal 50 and the common bias signal 52 above respective biasing thresholds. In contrast, a de-assertion of the first bias signal 48 means that the bias controller 58 generates the first bias signal 48 below a respective biasing threshold.

The bias controller 58 may assert the second bias signal 50 above a respective biasing voltage of the transistor $Q_9$ to cause the transistor $Q_9$ to be turned on. Accordingly, the battery voltage $V_{BAT}$ can be coupled to the second multi-stage power amplifier 32 to cause the second input stage 40 to be activated. The bias controller 58 may assert the second bias signal 50 above a respective biasing voltage of the transistor $Q_{13}$ to cause the transistor $Q_{13}$ to be turned on. Accordingly, a voltage at the coupling node A is pulled to the ground. As a result, the transistor $Q_6$ is turned off to block the common bias signal 52 from the first output stage 38 of the first multi-stage power amplifier 28, thus causing the first output stage 38 of the first multi-stage power amplifier 28 to be deactivated. Notably, the diodes $D_1$ and $D_2$ are provided between the coupling node A and the ground to prevent excessive current drain from the common biasing bump pad 64 to the ground via the resistor $R_{ref2}$, the resistor $R_1$, the diodes $D_1$ and $D_2$, and the transistor $Q_{13}$.

The bias controller 58 may assert the common bias signal 52 above a respective biasing voltage of the transistor $Q_{10}$ to cause the transistor $Q_{10}$ to be turned on. Accordingly, the battery voltage $V_{BAT}$ can be coupled to the second multi-stage power amplifier 32 to cause the second output stage 42 to be activated. The bias controller 58 may assert the first bias signal 48 below a respective biasing voltage of the transistor $Q_3$ to cause the transistor $Q_3$ to be turned off, thus blocking the battery voltage $V_{BAT}$ from the first multi-stage power amplifier 28 to cause the first input stage 36 to be deactivated.

In this regard, since the first input stage 36 and the first output stage 38 of the first multi-stage power amplifier 28 are both deactivated, the first multi-stage power amplifier 28 is thus deactivated. In contrast, since the second input stage 40 and the second output stage 42 of the second multi-stage power amplifier 32 are both activated, the second multi-stage power amplifier 32 is thus activated.

FIG. 3C is a schematic diagram of an exemplary bias circuit 44C, which can be provided in the power amplifier apparatus 26 of FIG. 2 as the bias circuit 44. In the bias circuit 44C, the first biasing bump pad 60 is coupled to the first output stage 38 of the first multi-stage power amplifier 28. Accordingly, the first bias signal 48 is configured to activate or deactivate the first output stage 38 of the first multi-stage power amplifier 28. In a non-limiting example, the first biasing bump pad 60 is coupled to the first output stage 38 via the resistor $R_{ref2}$, the transistor $Q_6$, and the resistor $R_{b2}$. The resistor $R_{ref2}$ is further coupled to a ground via the transistors $Q_4$ and $Q_5$. The first biasing bump pad 60 is further coupled to the transistor $Q_{14}$ via the resistor $R_4$.

The second biasing bump pad 62 is coupled to the second output stage 42 of the second multi-stage power amplifier 32. Accordingly, the second bias signal 50 is configured to activate or deactivate the second output stage 42 of the second multi-stage power amplifier 32. In a non-limiting example, the second biasing bump pad 62 is coupled to the second output stage 42 via the resistor $R_{ref4}$, the transistor $Q_{10}$, and the resistor $R_{b4}$. The resistor $R_{ref4}$ is further coupled to the ground via the transistors $Q_{12}$ and $Q_{11}$. The second biasing bump pad 62 is further coupled to the transistor $Q_{13}$ via the resistor $R_3$.

The common biasing bump pad 64 is coupled to the first input stage 36 of the first multi-stage power amplifier 28 as well as the second input stage 40 of the second multi-stage power amplifier 32. Accordingly, the common bias signal 52 can be configured to activate or deactivate the first input stage 36 of the first multi-stage power amplifier 28 and the second input stage 40 of the second multi-stage power amplifier 32. In a non-limiting example, the common biasing bump pad 64 is coupled to the first input stage 36 of the first multi-stage power amplifier 28 via the resistor $R_{ref1}$, the resistor $R_1$, the transistor $Q_3$, and the resistor $R_{b1}$. The resistor $R_{ref1}$ is further coupled to the ground via transistor $Q_1$. A coupling node A, which is located in between the resistor $R_1$ and the transistor $Q_3$, is coupled to the ground via diodes $D_1$ and $D_2$, and the transistor $Q_{13}$. The transistor $Q_3$ is coupled to the transistor $Q_1$ via a resistor $R_{fb2}$. The transistor $Q_3$, the resistor $R_{fb2}$, and the transistor $Q_1$ collectively form a first closed-loop feedback path 68.

In the same non-limiting example, the common biasing bump pad 64 is also coupled to the second input stage 40 of the second multi-stage power amplifier 32 via the resistor $R_{ref3}$, the resistor $R_2$, transistor $Q_9$, and the resistor $R_{b3}$. The resistor $R_{ref3}$ is further coupled to the ground via transistor $Q_8$. Another coupling node B, which is located in between the resistor $R_2$ and transistor $Q_9$, is coupled to the ground via diodes $D_3$ and $D_4$ and the transistor $Q_{14}$. The transistor $Q_9$ is coupled to the transistor $Q_8$ via a resistor $R_{fb1}$. The transistor $Q_9$, the resistor $R_{fb1}$, and the transistor $Q_8$ collectively form a second closed-loop feedback path 70.

Those skilled in the art will recognize improvements and modifications to the embodiments of the present disclosure. All such improvements and modifications are considered within the scope of the concepts disclosed herein and the claims that follow.

What is claimed is:

1. A power amplifier apparatus comprising:
   a first multi-stage power amplifier comprising a first number of stages and configured to amplify a first radio frequency (RF) signal;
   a second multi-stage power amplifier comprising a second number of stages and configured to amplify a second RF signal; and
   a bias circuit configured to generate a plurality of bias signals configured to:
   activate one of the first multi-stage power amplifier and the second multi-stage power amplifier; and
   deactivate another one of the first multi-stage power amplifier and the second multi-stage power amplifier;
   wherein a number of the plurality of bias signals is less than a count of the first number of stages and the second number of stages.

2. The power amplifier apparatus of claim 1 wherein the bias circuit is further configured to activate the first multi-stage power amplifier and deactivate the second multi-stage power amplifier concurrently.

3. The power amplifier apparatus of claim 1 wherein the bias circuit is further configured to deactivate the first multi-stage power amplifier and activate the second multi-stage power amplifier concurrently.

4. The power amplifier apparatus of claim 1 wherein the bias circuit is further configured to generate the plurality of bias signals comprising a plurality of bias current signals.

5. The power amplifier apparatus of claim 1 wherein the bias circuit is further configured to generate the plurality of bias signals comprising a plurality of bias voltage signals.

6. The power amplifier apparatus of claim 1 wherein the bias circuit comprises a bias controller configured to:
   receive a bias indication signal indicative of the one of the first multi-stage power amplifier and the second multi-stage power amplifier to be activated; and
   generate the plurality of bias signals to activate the one of the first multistage power amplifier and the second multi-stage power amplifier and deactivate the another one of the first multi-stage power amplifier and the second multi-stage power amplifier.

7. The power amplifier apparatus of claim 6 wherein the bias controller is further configured to receive the bias indication signal from a transceiver circuit.

8. The power amplifier apparatus of claim 7 further comprising the transceiver circuit.

9. The power amplifier apparatus of claim 1 wherein the plurality of bias signals comprises:
   a first bias signal configured to bias the first multi-stage power amplifier;
   a second bias signal configured to bias the second multi-stage power amplifier; and
   a common bias signal configured to bias the first multi-stage power amplifier and the second multi-stage power amplifier.

10. The power amplifier apparatus of claim 9 wherein:
    the first multi-stage power amplifier comprises a first input stage and a first output stage coupled to the first input stage; and
    the second multi-stage power amplifier comprises a second input stage and a second output stage coupled to the second input stage.

11. The power amplifier apparatus of claim 10 wherein the bias circuit is further configured to:
    provide the first bias signal to the first output stage;
    provide the second bias signal to the second output stage; and
    provide the common bias signal to the first input stage and the second input stage.

12. The power amplifier apparatus of claim 11 wherein the bias circuit is further configured to:
    assert the common bias signal and the first bias signal above respective biasing thresholds to activate the first multi-stage power amplifier; and
    assert the common bias signal and de-assert the second bias signal below a respective biasing threshold to deactivate the second multi-stage power amplifier.

13. The power amplifier apparatus of claim 12 wherein the bias circuit is further configured to:
    assert the common bias signal to activate the first input stage and deactivate the second input stage;
    assert the first bias signal to activate the first output stage; and
    de-assert the second bias signal to deactivate the second output stage.

14. The power amplifier apparatus of claim 11 wherein the bias circuit is further configured to:
    assert the common bias signal and the second bias signal to activate the second multi-stage power amplifier; and
    assert the common bias signal and de-assert the first bias signal to deactivate the first multi-stage power amplifier.

15. The power amplifier apparatus of claim 14 wherein the bias circuit is further configured to:
    assert the common bias signal to deactivate the first input stage and activate the second input stage;
    de-assert the first bias signal to deactivate the first output stage; and
    assert the second bias signal to activate the second output stage.

16. The power amplifier apparatus of claim 10 wherein the bias circuit is further configured to:
    provide the first bias signal to the first input stage;

provide the second bias signal to the second input stage; and provide the common bias signal to the first output stage and the second output stage.

17. The power amplifier apparatus of claim 16 wherein the bias circuit is further configured to:
assert the common bias signal and the first bias signal to activate the first multi-stage power amplifier; and
assert the common bias signal and de-assert the second bias signal to deactivate the second multi-stage power amplifier.

18. The power amplifier apparatus of claim 17 wherein the bias circuit is further configured to:
assert the common bias signal to activate the first output stage and deactivate the second output stage;
assert the first bias signal to activate the first input stage; and
de-assert the second bias signal to deactivate the second input stage.

19. The power amplifier apparatus of claim 16 wherein the bias circuit is further configured to:
assert the common bias signal and the second bias signal to activate the second multi-stage power amplifier; and
assert the common bias signal and de-assert the first bias signal to deactivate the first multi-stage power amplifier.

20. The power amplifier apparatus of claim 19 wherein the bias circuit is further configured to:
assert the common bias signal to deactivate the first output stage and activate the second output stage;
de-assert the first bias signal to deactivate the first input stage; and
assert the second bias signal to activate the second input stage.

* * * * *